United States Patent
Misaki et al.

(10) Patent No.: US 7,696,544 B2
(45) Date of Patent: Apr. 13, 2010

(54) SOLID-STATE IMAGE SENSING DEVICE AND MANUFACTURING METHOD THEREOF

(75) Inventors: Makoto Misaki, Kyoto (JP); Masafumi Tsutsui, Shiga (JP)

(73) Assignee: Panasonic Corporation, Osaka (JP)

( * ) Notice: Subject to any disclaimer, the term of this patent is extended or adjusted under 35 U.S.C. 154(b) by 143 days.

(21) Appl. No.: 11/700,000

(22) Filed: Jan. 31, 2007

(65) Prior Publication Data

US 2007/0272958 A1 Nov. 29, 2007

(30) Foreign Application Priority Data

May 26, 2006 (JP) .............................. 2006-146879

(51) Int. Cl.
*H01L 31/062* (2006.01)
(52) U.S. Cl. ................. 257/291; 257/E27.133
(58) Field of Classification Search ........... 257/291, 257/292, 443, 444, 446, E27.132, E27.133
See application file for complete search history.

(56) References Cited

U.S. PATENT DOCUMENTS 7,138,287 B2 * 11/2006 Mouli et al. ................. 438/48
7,217,968 B2 * 5/2007 Adkisson et al. ............ 257/292
7,364,960 B2 * 4/2008 Lyu ........................... 438/204

FOREIGN PATENT DOCUMENTS

JP 2003-142674 5/2003

* cited by examiner

*Primary Examiner*—David Vu
(74) *Attorney, Agent, or Firm*—McDermott Will & Emery LLP

(57) ABSTRACT

Pixel portions each of which has a charge storage portion formed in a semiconductor substrate 11 and a transfer gate for transferring charges stored in the charge storage portion are isolated from each other by a device isolation region in the semiconductor substrate. A buried gate electrically connected to the transfer gate is embedded in the device isolation region. The buried gate includes a gate dielectric film and gate electrode formed in a trench of the semiconductor substrate.

9 Claims, 16 Drawing Sheets

SOLID-STATE IMAGE SENSING DEVICE AND MANUFACTURING METHOD THEREOF

CROSS-REFERENCE TO RELATED APPLICATION(S)

This application claims priority under 35 U.S.C. §119(a) on Japanese Patent Application No. 2006-146879 filed on May 26, 2006, the entire contents disclosed in claims, specification, and drawings of which are hereby incorporated by reference.

BACKGROUND OF THE INVENTION

1. Field of the Invention

The present invention relates to a solid-state image sensing device and a manufacturing method thereof. Specifically, the present invention relates to a solid-state image sensing device and a manufacturing method thereof in which miniaturization of device does not deteriorate image properties.

2. Description of the Prior Art

In recent years, among solid-state image sensing devices, a solid-state image sensing device using an amplification-type MOS sensor has been a subject of interest. In this solid-state image sensing device, a signal detected by a photodiode is amplified by a transistor on a pixel to pixel basis. Such solid-state image sensing device is characterized by high sensibility. Moreover, due to miniaturization of pixels in recent years, a device isolation structure formed by Shallow Trench Isolation (STI) is employed for solid-state image sensing devices. STI is the technique of forming a trench on a principal surface of a semiconductor substrate, forming a dielectric film, such as oxide film, in the trench, and performing planarization, so that a device isolation region is formed. Side surfaces of the trench can be formed by STI at a steep angle to the principal surface of the semiconductor substrate. Therefore, the width of the device isolation region formed by STI is narrower than that of a device isolation region formed by LOCOS (Local Oxidation of Silicon).

However, progressing miniaturization of device requires a high impurity concentration and a deep diffusion region of the photodiode in order to improve saturation characteristics of the solid-state image sensing device. However, an incident light at an oblique angle to the deep diffusion region may produce charges in a deep portion of the photodiode, and the generated charges may be stored as signal charges in an adjacent photodiode, which may cause a problem, so-called cross talk.

A method to solve the above-mentioned problem, that is, the cross talk due to a deep photodiode, is disclosed in Gazette of Japanese Laid-Open Patent Publication No. 2003-142674 (patent document). Referring to FIG. 16, a solid-state image sensing device disclosed in the document will be described below.

As shown in FIG. 16, a P-type silicon substrate 101 has a trench isolation region 102 which isolates a pixel region. The pixel region has a charge storage portion (photodiode) 103 formed by an N-type impurity layer, a transfer gate 104 for transferring charges stored in the charge storage portion 103, and a floating diffusion (FD) portion 105 for storing the transferred charges.

In this case, a P-type device isolation diffusion region 106 surrounds the trench isolation region 102. The P-type device isolation diffusion region 106 extends under a bottom surface of the trench isolation region 102 to a position deeper than the charge storage portion 103. This structure allows to block a transfer of charges between pixels and thus to prevent the cross talk even in a case of a deep charge storage portion 103 due to the progressing miniaturization of device.

SUMMARY OF THE INVENTION

Miniaturization of device requires a deep charge storage portion (photodiode) in order to improve saturation characteristics of a solid-state image sensing device. The deep charge storage portion may cause a problem, that is, cross talk. This problem can be prevented by the method disclosed in the patent document. However, inventers of the present invention found that forming a deep photodiode might cause a novel problem besides the cross talk. The novel problem found by the inventors is that in a deep photodiode, a voltage applied to a transfer gate can not completely transfer a voltage stored in the photodiode to a floating diffusion portion, which causes a residual image. With reference to FIGS. 1A and 1B, explanations as to this novel problem will be given below.

FIG. 1A is a cross section schematically illustrating a structure of a pixel portion in a solid-state image sensing device. A semiconductor substrate 11 has a charge storage portion (photodiode) 14, a transfer gate 15, and a floating diffusion (FD) portion 16. Note that, generally, a depletion prevention region 17 is provided on a surface of the charge storage portion 14. The depletion prevention region 17 is formed by an impurity layer having a conductivity type opposite to a conductivity type of an impurity layer forming the charge storage portion 14.

FIG. 1B is a graph of one-dimension potential distribution in a current path from the charge storage portion 14 to the floating diffusion portion 16 (indicated by an arrow OPQ in FIG. 1A), which was simulated for the application of a voltage to the transfer gate 15. The simulation result is plotted over the depth of the charge storage portion 14. The simulation was carried out on the conditions that the semiconductor substrate 11 is a P-type silicon substrate (impurity concentration: $1 \times 10^{14}/cm^3$), the charge storage portion 14 is formed by ion implantation of As impurity at a dose amount of $2.2 \times 10^{12}/cm^2$ (4-step implantation of $5.5 \times 10^{11}/cm^2$) varying the implantation energy from 200 KeV to 600 KeV, and the voltage applied to the transfer gate 15 is 2.9 V.

It can be seen from FIG. 1B that a slightly declined part appears in the profile of the potential distribution for the implantation energy of 400 KeV, and a greatly declined part appears in the profile of the potential distribution for the implantation energy of 600 KeV. Therefore, it can be understood that as the implantation energy increases, in other words, the charge storage portion 14 deepens, a declined part in the profile of the potential distribution becomes more apparent and deeper.

Causes of such phenomenon are not specifically clarified. However, it can be expected that increased implantation energy deepens a high concentration region in the charge storage portion 14, but the deepened high concentration region is hardly depleted and potential does not increase in the region which is not depleted, which causes a declined part. Moreover, it can be presumed that such tendency becomes more prominent as a concentration of the charge storage portion 14 further increases.

As the charge storage portion 14 deepens, a greatly declined part appears in the profile of the potential distribution shown in FIG. 1B. In this case, due to the declined part, applying a voltage to the transfer gate 15 does not completely deplete the charge storage portion 14. As a result, it is difficult to completely transfer charges stored in the charge storage portion 14 to the floating diffusion portion 16. That is, forming a deep charge storage portion 14 due to the progressing miniaturization of device causes a novel problem, namely a residual image, besides the cross talk, which is a conventional problem. This may deteriorate image properties of a solid-state image sensing device.

In view of the above-mentioned problems, a main object of the present invention is to provide a solid-state image sensing device having excellent image properties without residual image even in a case of a deep charge storage portion 14 due to the progressing miniaturization of device, and a manufacturing method of such solid-state image sensing device.

In order to achieve the above-mentioned object, a solid-state image sensing device of the present invention has a buried gate in a device isolation region isolating pixel portions besides the transfer gate.

That is, a solid-state image sensing device includes pixel portions each of which has a charge storage portion and a transfer gate for transferring charges stored in the charge storage portion, the pixel portions being isolated from each other by a device isolation region formed in a semiconductor substrate, wherein a buried gate which is electrically connected to the transfer gate is embedded in at least a part of the device isolation region.

According to this structure, even in a case of a deep charge storage portion due to the progressing miniaturization of device, a voltage which has the same electric potential as that of a voltage applied to the transfer gate is applied to the buried gate embedded in the device isolation region. Therefore, it is possible to apply potential to a bottom portion of the charge storage portion to deplete the bottom portion of the charge storage portion. This enables a complete transfer of the charges stored in the charge storage portion. In this way, it is possible to realize a solid-state image sensing device having excellent image properties without residual image.

In a preferable embodiment, a gate dielectric film of the buried gate and a gate dielectric film of the transfer gate are continuously formed by the same dielectric film.

Moreover, a gate electrode of the buried gate and a gate electrode of the transfer gate are continuously formed by the same conductive film.

In this structure, the buried gate is structured in common with the transfer gate, so that it is possible to facilitate the formation of the buried gate.

In a preferable embodiment, the buried gate embedded in the device isolation region surrounds the charge storage portion.

Moreover, the buried gate is embedded in part of the device isolation region under the transfer gate.

The buried gate embedded in such position allows more efficient depletion of the charge storage portion and easy electrical connection of the transfer gate with the buried gate.

In a preferable embodiment, the device isolation region has a depth of 1/3 or more of a depth of the charge storage portion.

Moreover, it is preferable that the charge storage portion has a depth of 0.3 μm or more from a surface of the semiconductor substrate.

Moreover, it is preferable that the device isolation region has a trench structure.

A manufacturing method of a solid-state image sensing device having a charge storage portion and a transfer gate for transferring charges stored in the charge storage portion according to the present invention includes the steps of: (a) forming a trench in a device isolation region of a semiconductor substrate; (b) forming a first gate isolation film on bottom and side surfaces of the trench; (c) after step (b), forming a conductive film in at least a part of the trench to form a buried gate electrode; (d) performing an ion implantation of an impurity having a conductivity type opposite to that of the semiconductor substrate to form a charge storage portion in a region in the semiconductor substrate surrounded by the trench; (e) forming a second gate dielectric film on a region of the semiconductor substrate surrounded by the trench; and (f) forming a transfer gate electrode on the second gate dielectric film, wherein the buried gate electrode and the transfer gate electrode are electrically connected with each other.

In a preferable embodiment, step (b) and step (e) are simultaneously performed to form the same dielectric film on the bottom and the side surfaces of the trench and the semiconductor substrate, such that the first gate dielectric film and the second gate dielectric film are formed by the same dielectric film.

In a preferable embodiment, step (c) and step (f) are simultaneously performed to form the same conductive film on the first gate dielectric film and the second gate dielectric film, such that the buried gate electrode and the transfer gate electrode are formed by the same conductive film.

In a preferable embodiment, in step (c), the buried gate is formed by forming the conductive film in the trench to surround the charge storage portion.

In a preferable embodiment, the conductive film is a polysilicon film.

In the solid-state image sensing device according to the present invention, even in a case of a deep charge storage portion (photodiode), it is possible to apply a potential to a deep part of the charge storage portion by applying a voltage from an electrode provided in the device isolation region, so that the deep part of the charge storage portion can be depleted. This makes it possible to completely transfer stored charges, and thus it is possible to realize a solid-state image sensing device having excellent image properties without residual image.

Moreover, according to the solid-state image sensing device of the present invention, the buried gate surrounds the entire charge storage portion, so that a higher effectiveness in suppressing residual image can be obtained. This allows a deep charge storage portion with an increased density. As a result, it is possible to miniaturize the solid-state image sensing device.

DESCRIPTION OF THE PREFERRED EMBODIMENTS

Figure 1A:
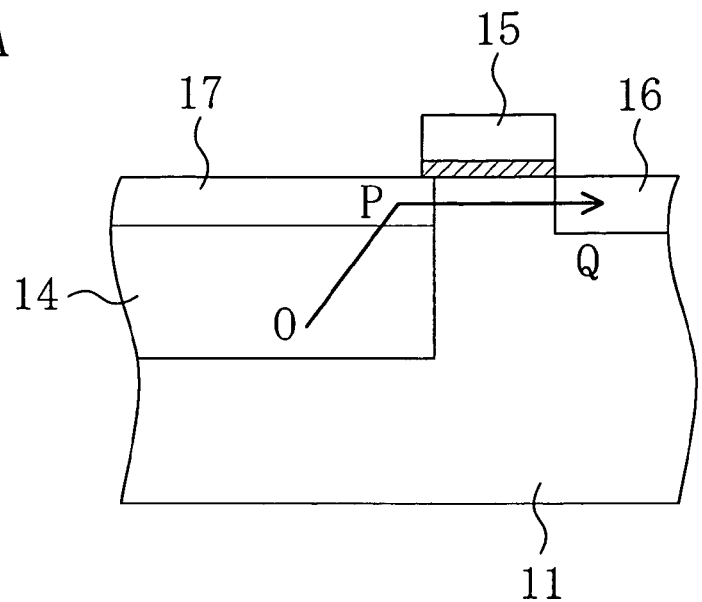
FIG. 1A is a cross section illustrating a basic structure of a solid-state image sensing device, with which a problem as to residual image to be solved by the present invention is explained.

Embodiments of the present invention will be described below with reference to the drawings. For the sake of simplicity of description, in the drawings, the same reference numerals are given to components having substantially the same function. Note that, the present invention is applicable, but not exclusively, to the following embodiments.

Embodiment 1

Figure 2A:
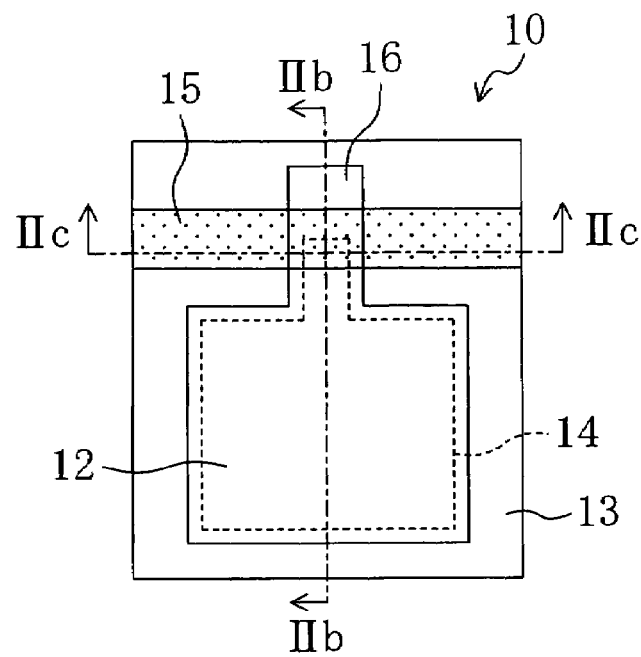
FIG. 2A is a plan view schematically illustrating a structure of a solid-state image sensing device according to Embodiment 1 of the present invention.
Figure 2B:
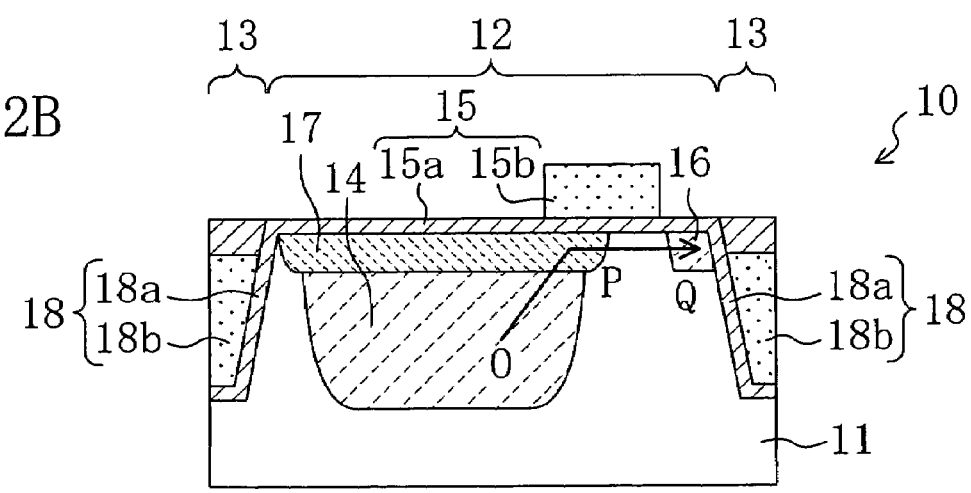
FIG. 2B is a cross section along the line IIb-IIb in FIG. 2A.
Figure 2C:
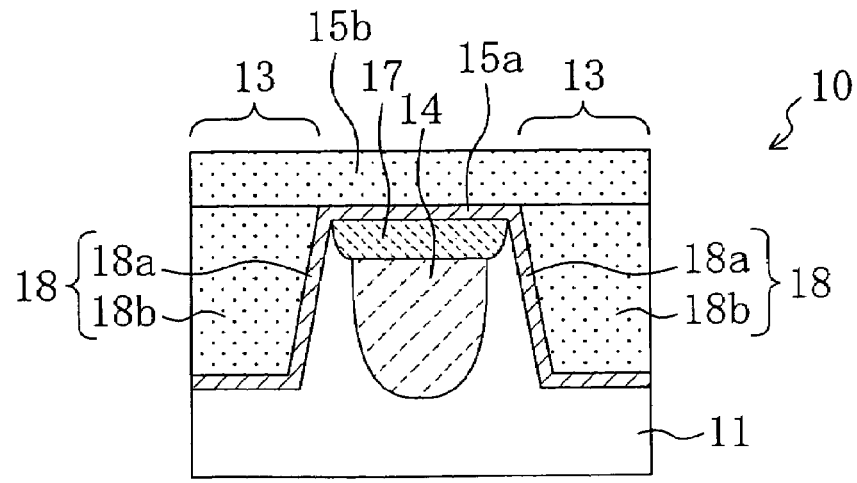
FIG. 2C is a cross section along the line IIc-IIc in FIG. 2A.

In FIGS. 2A through 2C, a structure of a solid-state image sensing device 10 according to Embodiment 1 of the present invention is schematically shown, where FIG. 2A is a plan view of the solid-state image sensing device 10, FIG. 2B is a cross section along the line IIb-IIb in FIG. 2A, and FIG. 2C is a cross section along the line IIc-IIc in FIG. 2A.

As shown in FIGS. 2A through 2C, in the solid-state image sensing device 10 according to Embodiment 1, pixel portions 12 each of which has a charge storage portion 14 in a semiconductor substrate 11 and a transfer gate 15 for transferring charges stored in the charge storage portion 14 are isolated from each other by a device isolation region 13 in the semiconductor substrate 11, and a buried gate 18 which is electrically connected to the transfer gate 15 is provided in the device isolation region 13.

As shown in FIG. 2B, the transfer gate 15 includes a gate dielectric film (second gate dielectric film) 15a and a gate electrode (second gate electrode) 15b on the semiconductor substrate 11. The buried gate 18 includes a gate dielectric film (first gate dielectric film) 18a and a gate electrode (first gate electrode) 18b in a trench of the semiconductor substrate 11.

In Embodiment 1, the gate dielectric film 18a of the buried gate 18 and the second gate dielectric film 15a of the transfer gate 15 are continuously formed by the same dielectric film. Moreover, the gate electrode 18b of the buried gate 18 and the second gate electrode 15b of the transfer gate 15 are continuously formed by the same conductive film. To transfer the charges stored in the charge storage portion 14, a voltage having the same electric potential as that of a voltage applied to the transfer gate 15 is applied to the buried gate 18.

That is, a voltage to the charge storage portion 14 is applied not only from a surface but also from side surfaces of the charge storage portion 14. A deep charge storage portion 14 may cause the declined part in the potential distribution shown in FIG. 1B. However, in the structure of Embodiment 1, it is possible to apply potential to a deep part of the charge storage portion 14 to completely deplete the charge storage portion 14. Therefore, it is possible to completely transfer the charges stored in the charge storage portion 14 to the floating diffusion (FD) portion 16, so that the occurrences of residual image can be suppressed.

Moreover, in Embodiment 1, as shown in FIGS. 2B and 2C, the buried gate 18 embedded in the device isolation region 13 surrounds the charge storage portion 14. That is, the entire device isolation region 13 is formed as the buried gate 18. Therefore, the device isolation region 13 not only electrically isolates the pixel portions 12 from each other but also constitutes a part of the transfer gate.

The above-mentioned structure does not require more areas than the conventional device isolation region. Therefore, an area requirement for the device does not increase. Moreover, a contact region for contacting the gate electrode 18b of the buried gate 18 is not necessary, because the gate electrode 18b of the buried gate 18 is electrically connected to the gate electrode 15b of the transfer gate 15 immediately below the transfer gate 15 as shown in FIG. 2C.

In the present invention, the buried gate 18 embedded in the device isolation region 13 also applies potential from the side surfaces of the charge storage portion 14. Therefore, the deeper the buried gate 18 is, i.e. the device isolation region 13 is, the more effective is the present invention. Therefore, it is preferable that the device isolation region 13 is formed as deeply as the device isolation region 13 sufficiently overlaps with the charge storage portion 14. However, the device isolation region 13 has greater stress than a device isolation region formed by conventional LOCOS isolation, because the device isolation region 13 is formed such that the trench is formed in the semiconductor substrate 11, and a conductive film (or dielectric film) is provided in the trench. Therefore, in a deep device isolation region 13, a leak current may increase due to the increased stress. Considering the above mentioned advantage and disadvantage, it is preferable in the present invention that the device isolation region 13 (buried gate 18) has a depth of ⅓ or more of the charge storage portion 14.

Figure 1B:
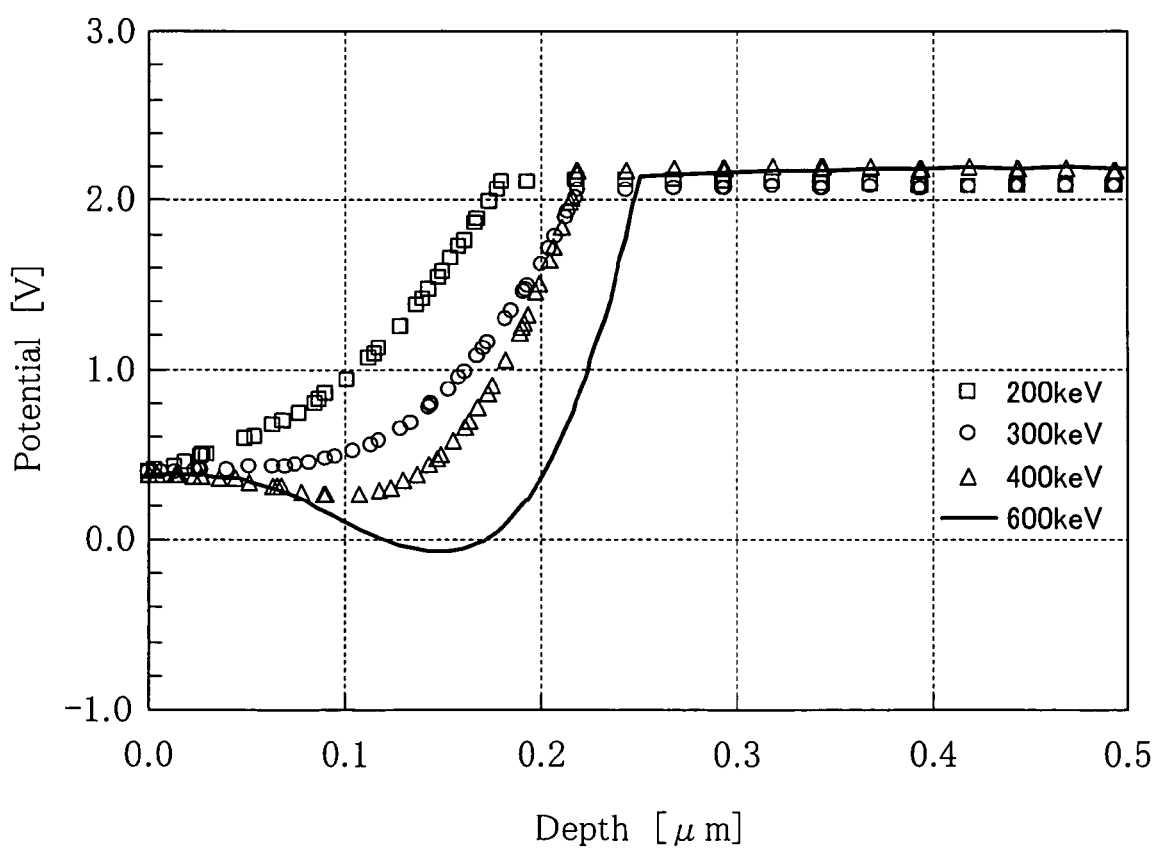
FIG. 1B is a graph illustrating potential distribution in a charge storage portion.
Figure 3:
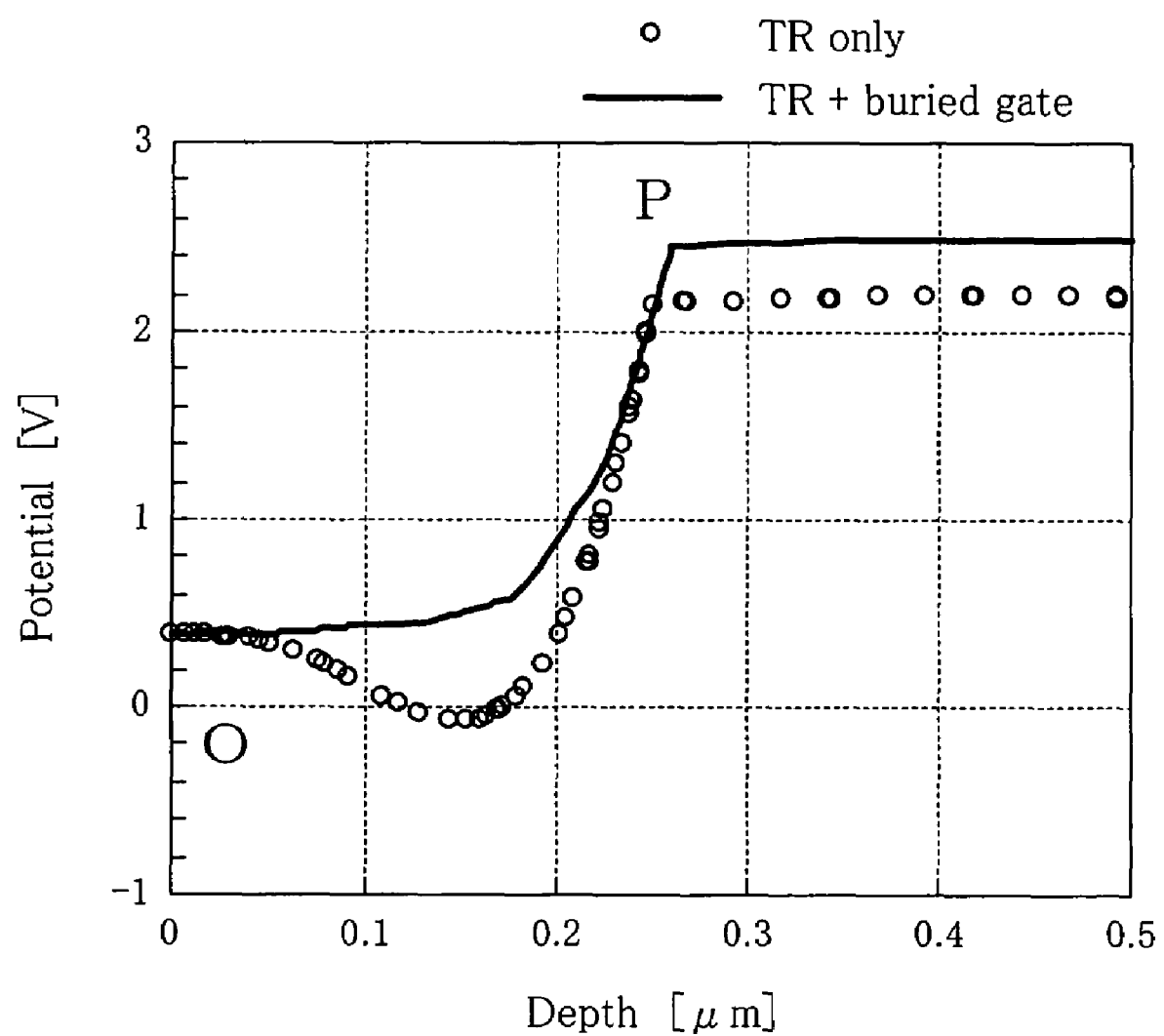
FIG. 3 is a graph illustrating potential distribution in a charge storage portion according to Embodiment 1 of the present invention.

FIG. 3 is a graph comparatively showing potential distribution in a case where a voltage is applied only to the transfer gate 15, and in a case where a voltage is applied both to the transfer gate 15 and the buried gate 18, where the charge storage portion 14 is formed under such a condition that a declined part appears in a profile of the potential distribution shown in FIG. 1B (implantation energy: 600 KeV).

As shown in FIG. 3, in the case where the voltage is applied to the transfer gate 15 and the buried gate 18, no declined parts appear in a profile of the potential distribution. This shows effects of applying potential from the side surfaces of the charge storage portion 14.

Referring to FIG. 2A through 2C again, a structure of the solid-state image sensing device 10 of Embodiment 1 will be described in detail.

As shown in FIGS. 2B and 2C, the pixel portion 12 of the semiconductor substrate 11 formed of P-type silicon has the transfer gate 15 which includes the gate dielectric film 15a and the gate electrode 15b. The gate dielectric film 15a is formed of, for example, silicon oxide having a thickness of 9 nm, and the gate electrode 15b is formed by, for example, a polysilicon film having a thickness of 165 nm. Moreover, in the semiconductor substrate 11, an N-type charge storage portion 14 having a depth of about 0.8 μm and a P-type depletion prevention region (P-type impurity diffusion layer) 17 are provided to overlap with the transfer gate 15. The N-type charge storage portion 14 is formed by, for example, an As impurity diffusion layer. The P-type depletion prevention region is provided to suppress occurrences of white point. Further, an N-type floating diffusion portion (for example, As impurity diffusion layer) 16 facing to the charge storage portion 14 is provided such that the transfer gate 15 is situated between the N-type floating diffusion portion 16 and the charge storage portion 14.

In the device isolation region 13, the buried gate 18 is formed in the trench having a depth of about 0.3 μm in the semiconductor substrate 11. The buried gate 18 includes the gate dielectric film 18a and the gate electrode 18b of the buried gate 18, the gate electrode 18b being formed by a polysilicon film. The gate dielectric film 18a of the buried gate 18 and the gate dielectric film 15a of the transfer gate 15 are continuously formed.

As shown in FIG. 2C, in the device isolation region 13, the gate electrode 15b of the transfer gate 15 is in contact with the gate electrode 18b of the buried gate 18 immediately below the transfer gate 15.

In Embodiment 1, the buried gate 18 embedded in the device isolation region surrounds the charge storage portion 14. However, it is not necessary that the buried gate 18 completely surrounds the charge storage portion 14. Moreover, the charge storage portion 14 is relatively deep and has a depth of 0.8 μm. However, the present invention is also effective in a charge storage portion 14 shallower than 0.8 μm.

Figure 4A:
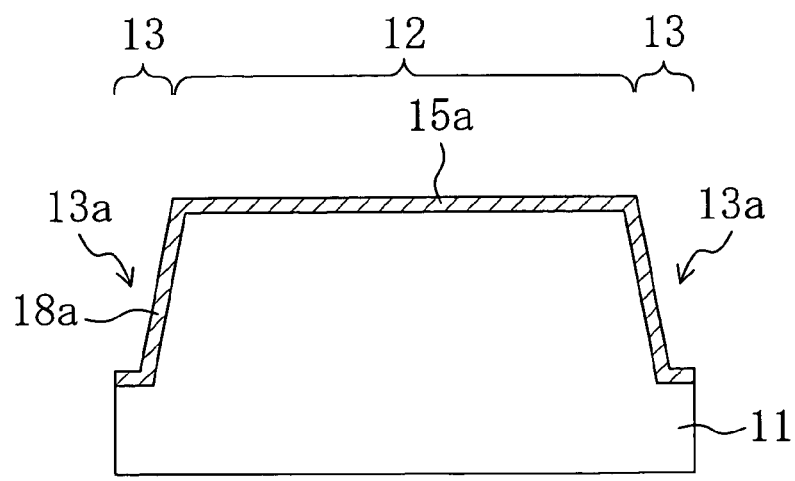
FIGS. 4A through 4C are cross sections along the line IIb-IIb in FIG. 2A, with which steps of a manufacturing method of the solid-state image sensing device according to Embodiment 1 of the present invention are illustrated.
Figure 4B:
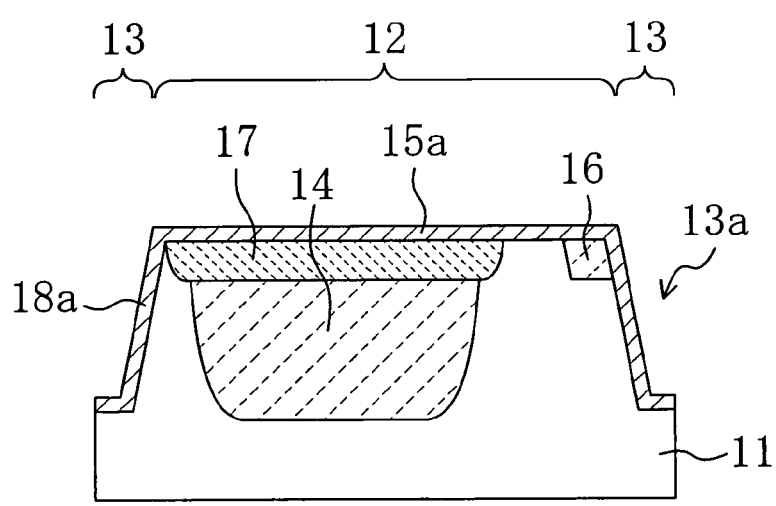
Figure 4C:
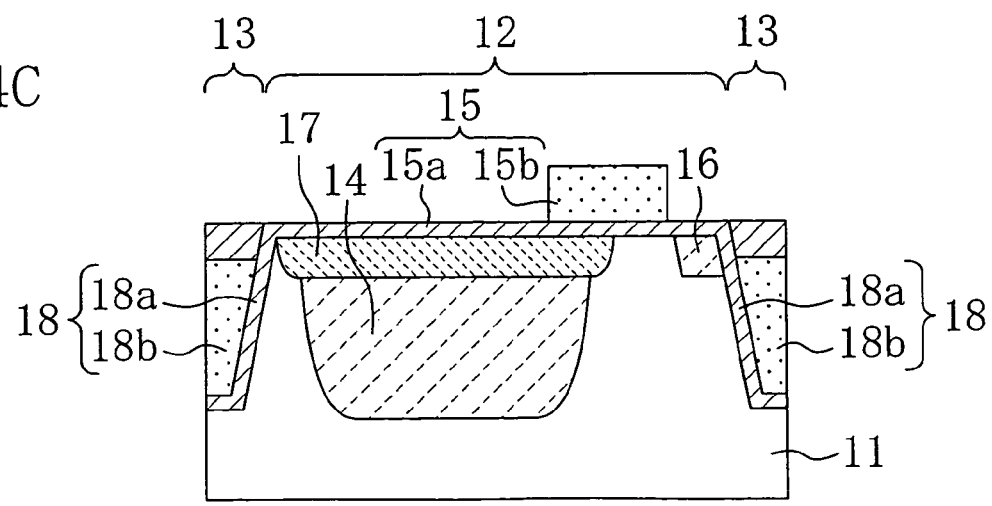
Figure 5A:
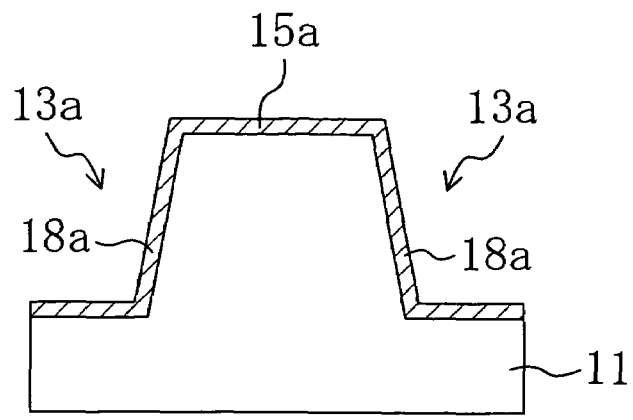
FIGS. 5A through 5C are cross sections along the line IIc-IIc in FIG. 2A, with which steps of a manufacturing method of the solid-state image sensing device according to Embodiment 1 of the present invention are illustrated.
Figure 5B:
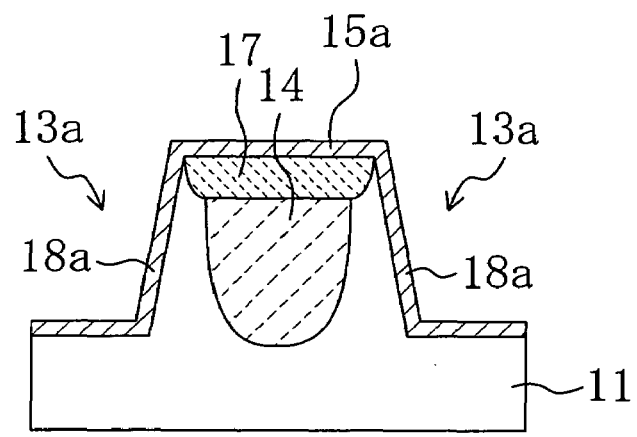
Figure 5C:
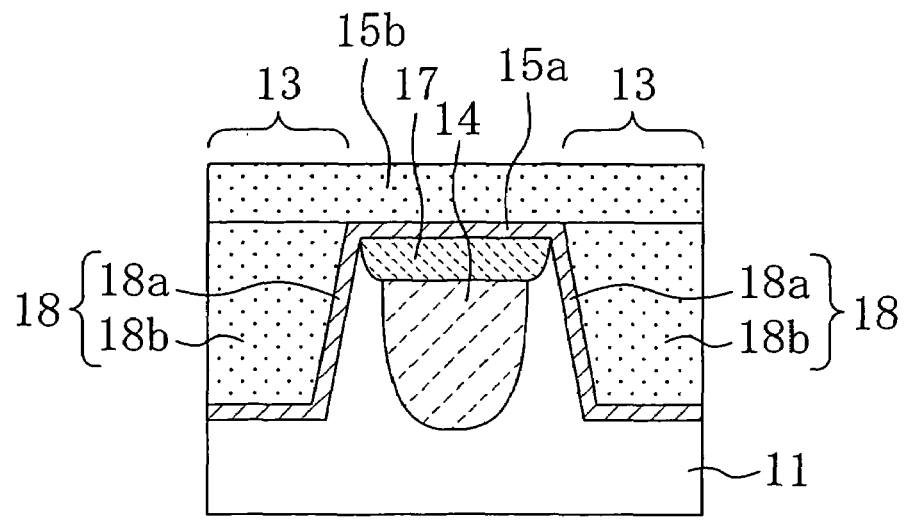

Next, a manufacturing method of the solid-state image sensing device 10 according to Embodiment 1 will be explained with reference to FIGS. 4A through 4C and FIGS. 5A through 5C. FIGS. 4A through 4C are cross sections along the line IIb-IIb in FIG. 2A, with which steps are described. FIGS. 5A through 5C are cross sections along the line IIc-IIc in FIG. 2A, with which steps are described.

First, referring to FIGS. 4A and 5A, a trench 13a having a depth of about 0.3 μm is formed in a semiconductor substrate 11 formed by a P-type silicon substrate. The trench 13a is to be a device isolation region 13. Then, a gate dielectric film 15a of a transfer gate 15 and a gate dielectric film 18a of a buried gate 18 are simultaneously formed by the same dielectric film, such as silicon oxide film having a thickness of 9 nm, on a surface of the semiconductor substrate 11 and on side surfaces of the trench 13a.

Before the gate dielectric films 15a and 18a are formed, an ion implantation of a P-type impurity, such as boron (B), into the semiconductor substrate 11 from the side surfaces of the trench 13a may be performed so as to form a P-type isolation diffusion layer (not shown) along the side surfaces of the trench 13a.

Subsequently, referring to FIGS. 4B and 5B, an ion implantation of a P-type impurity, such as B, into the semiconductor substrate 11 is performed using a resist mask so as to form a depletion prevention region 17. Further, an ion implantation of an N-type impurity, such as As, is performed at an implantation energy of 600 KeV and a dose amount of $2.2 \times 10^{12}/cm^2$ so as to form a charge storage portion 14. In this way, the charge storage portion 14 having a depth of about 0.8 μm from the surface of the substrate 11 is formed. Likewise, an ion implantation of an N-type impurity, such as As, into the semiconductor substrate 11 is performed so as to form a floating diffusion portion 16.

Note that, the gate dielectric films 15a and 18a may be formed after the formation of the depletion prevention region 17, the charge storage portion 14, and the floating diffusion portion 16.

Next, referring to FIGS. 4C and 5C, a conductive film, such as polysilicon film, is deposited on the semiconductor substrate 11 and in the trench 13a by CVD. Then, a surface of the polysilicon film is planarized by, for example, CMP (Chemical Mechanical Polishing). After that, a part of the planarized polysilicon film is etched by using a resist mask to pattern the gate electrode 15b of the transfer gate 15. In this way, the polysilicon film deposited in the trench 13a is formed into a gate electrode 18b of the buried gate 18.

After the gate electrode 18b of the buried gate 18 is formed by providing a polysilicon film in the trench 13a, the gate electrode 15b of the transfer gate 15 may be formed by forming another polysilicon film or other conductive film on the semiconductor substrate 11, and then, patterning the film on the semiconductor substrate 11 by using a resist mask.

In the present invention, after the gate dielectric film 18a is formed on the side surfaces of the trench 13a, the buried gate electrode 18b is formed in the trench 13a instead of forming the dielectric film in the trench 13a in the conventional step of forming the device isolation region. Such a simple contrivance enables the formation of the buried gate 18. Therefore, it is possible to easily manufacture the solid-state image sensing device 10 of the present invention.

Variations of Manufacturing Method

In a solid-state image sensing device using an amplification-type MOS sensor, it is possible to form, for example, an on-chip signal processing circuit including a MOS type transistor on a semiconductor substrate. Therefore, a manufacturing method of a solid-state image sensing device 10 of the present invention which can be applicable to the steps of forming such on-chip signal processing circuit will be described with reference to the drawings. FIGS. 6A through 6C and FIGS. 7A through 7C are cross sections along the line IIb-IIb in FIG. 2A, with which steps are described. FIGS. 8A through 8C and FIGS. 9A through 9C are cross sections along the line IIc-IIc in FIG. 2A, with which steps are described. Descriptions of steps corresponding to the manufacturing method described with reference to FIGS. 4A through 4C and FIGS. 5A through 5C are omitted.

Figure 6A:
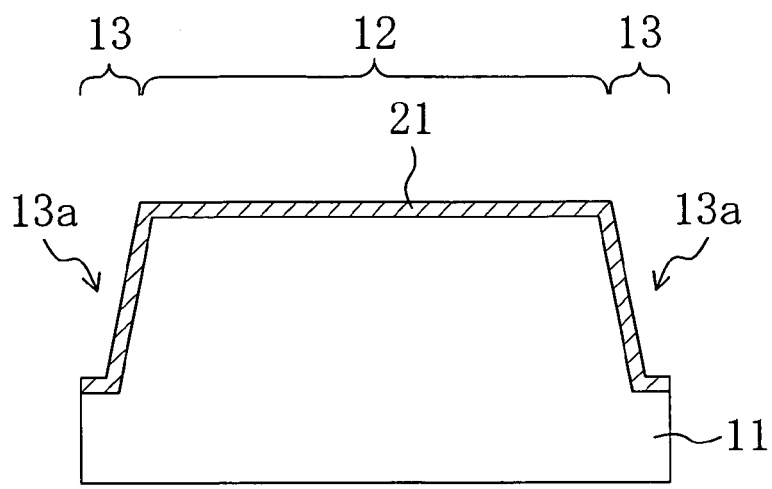
FIGS. 6A through 6C are cross sections along the line IIb-IIb in FIG. 2A, with which steps of a variation of a manufacturing method of the solid-state image sensing device according to Embodiment 1 of the present invention are illustrated.
Figure 8A:
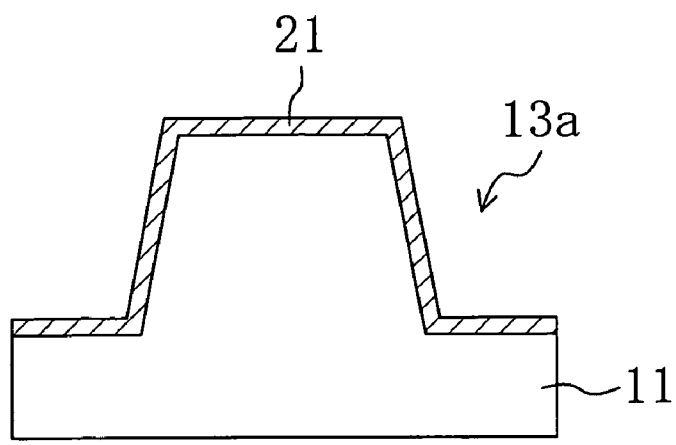
FIGS. 8A through 8C are cross sections along the line IIc-IIc in FIG. 2A, with which steps of a variation of a manufacturing method of the solid-state image sensing device according to Embodiment 1 of the present invention are illustrated.

First, referring to FIGS. 6A and 8A, a trench 13a having a depth of about 0.3 μm is formed in a semiconductor substrate 11 formed by the P-type silicon substrate. The trench 13a is to be a device isolation region 13. Then, a protection film 21, such as a silicon oxide film, used in ion implantation is formed on a surface of the semiconductor substrate 11 and on side surfaces of the trench 13a. Subsequently, an ion implantation of a P-type impurity, such as boron (B) into the semiconductor substrate 11 through the side surfaces of the trench 13a is performed so as to form a P-type isolation diffusion layer (not shown) along the side surfaces of the trench 13a.

Figure 6B:
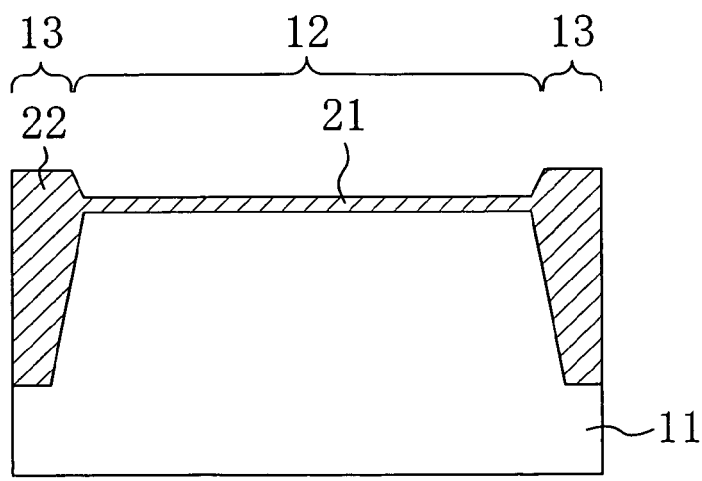
Figure 8B:
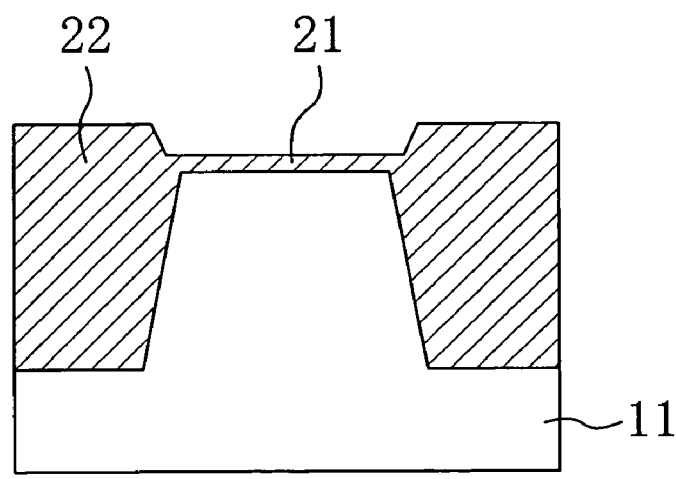

Next, referring to FIGS. 6B and 8B, a dielectric film 22, such as a silicon oxide film, is formed in the trench 13a, and then planarized by, for example, CMP so as to form the device isolation region 13 having an STI structure.

Figure 6C:
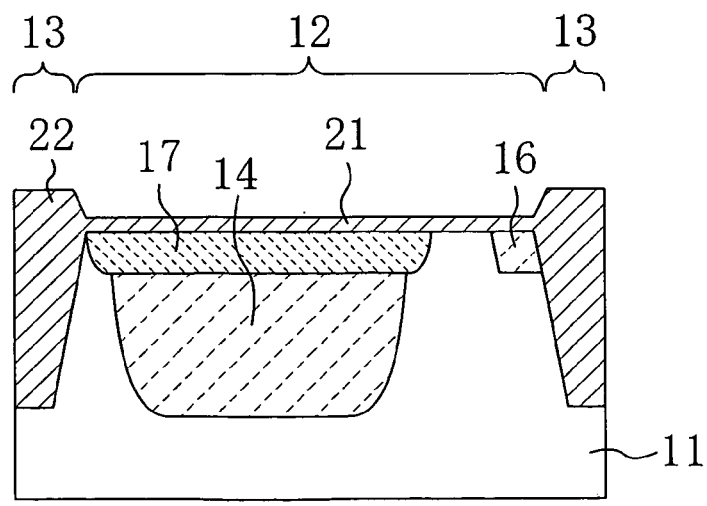
Figure 8C:
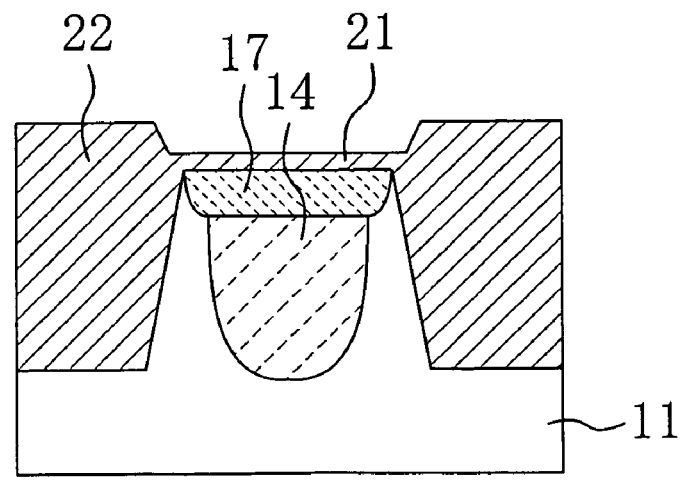

Next, referring to FIGS. 6C and 8C, an ion implantation is performed using a resist mask to form a depletion prevention region 17 which is a P-Type impurity layer, a charge storage portion 14 formed by an N-type impurity layer, and a floating diffusion portion 16 in the semiconductor substrate 11. Diffusion layers such as a source and a drain constituting a MOS transistor are also formed in the semiconductor substrate excepting a region in which the solid-state image sensing device 10 is to be formed.

Figure 7A:
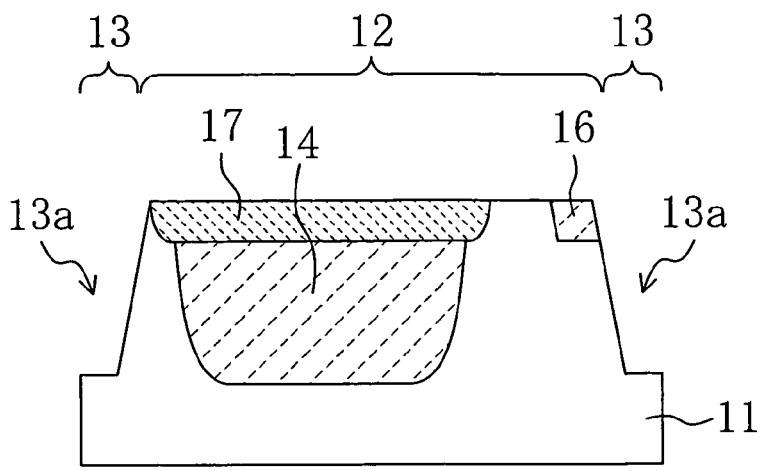
FIGS. 7A through 7C are cross sections along the line IIb-IIb in FIG. 2A, with which steps of a variation of a manufacturing method of the solid-state image sensing device according to Embodiment 1 of the present invention are illustrated.
Figure 9A:
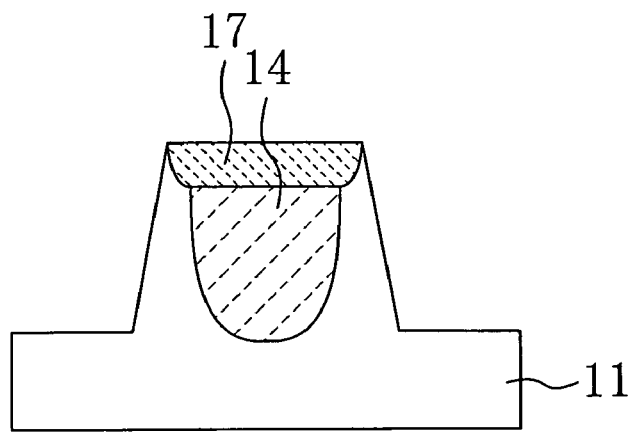
FIGS. 9A through 9C are cross sections along the line IIc-IIc in FIG. 2A, with which steps of a variation of a manufacturing method of the solid-state image sensing device according to Embodiment 1 of the present invention are illustrated.

After that, referring to FIGS. 7A and 9A, the dielectric film 22 and the protection film 21 are removed, the dielectric film 22 being embedded in the region of the device isolation region 13 in which the solid-state image sensing device 10 is to be formed, and the protection film 21 being formed on the surface of the semiconductor substrate 11.

Figure 7B:
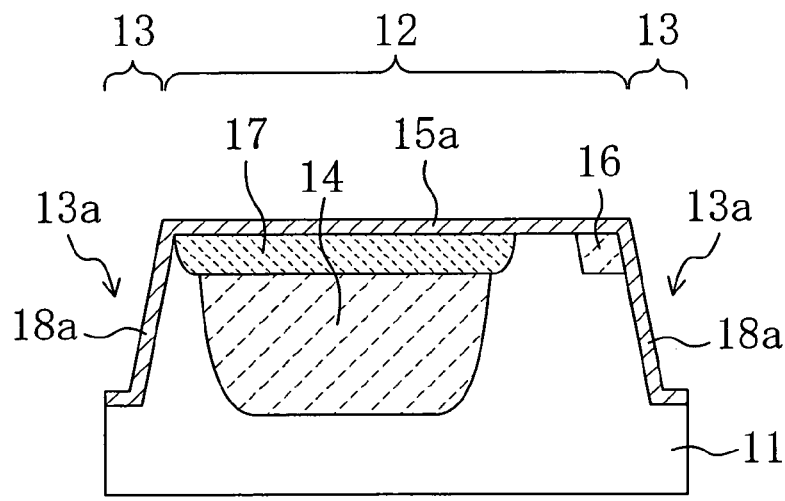
Figure 7C:
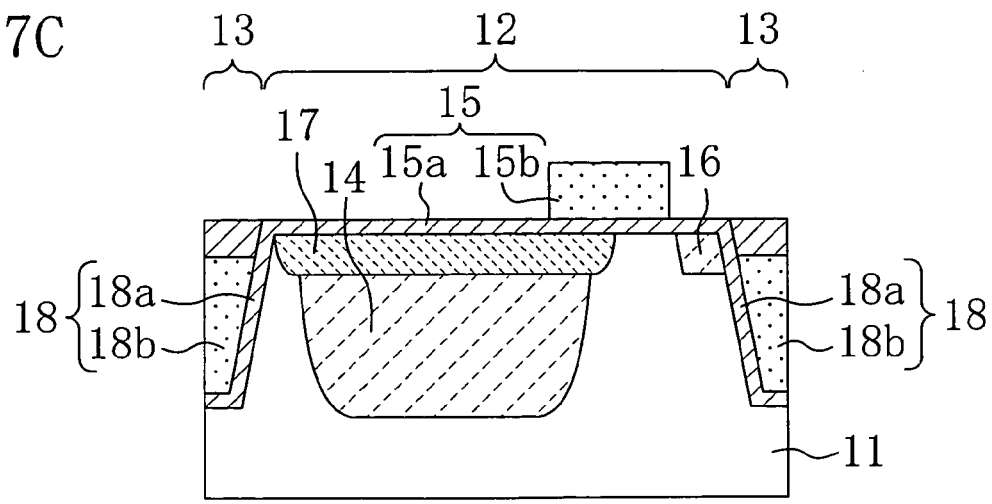
Figure 9B:
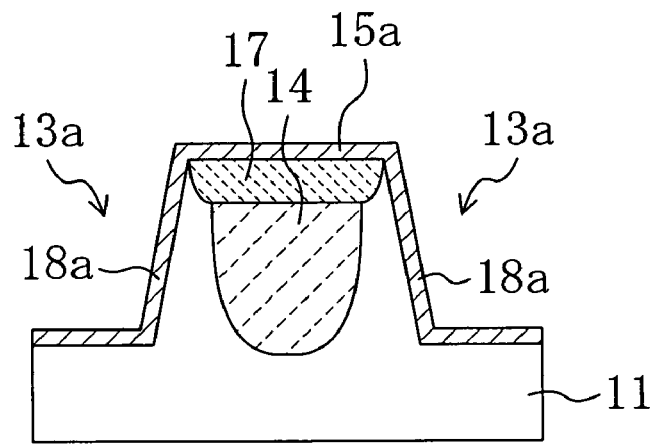
Figure 9C:
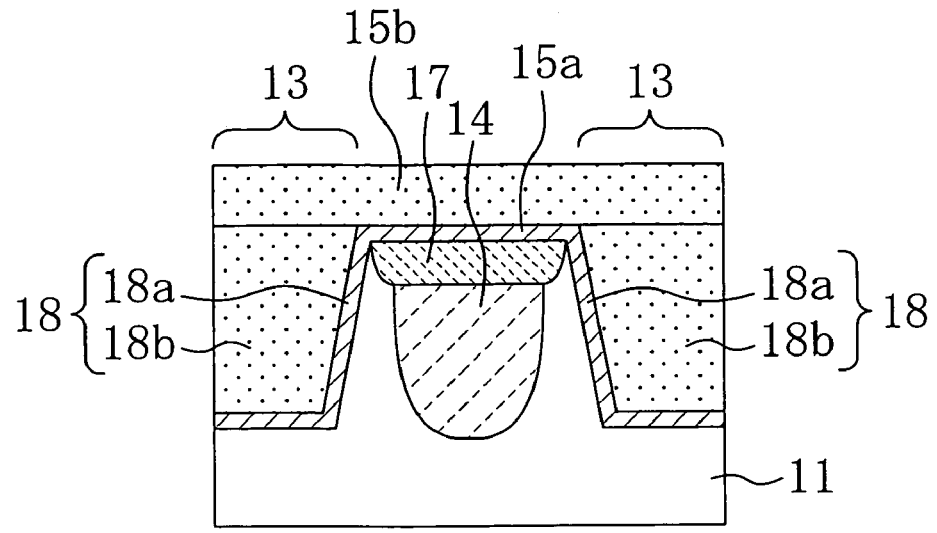

Next, referring to FIGS. 7B and 9B, the gate dielectric film 15a of the transfer gate 15 and the gate dielectric film 18a of the buried gate 18 are simultaneously formed by the same dielectric film, such as silicon oxide film having a thickness of 9 nm, on the surface of the semiconductor substrate 11 and the side surfaces of the trench portion 13a.

Finally, the conductive film, such as polysilicon film, is deposited on the semiconductor substrate 11 and in the trench 13a by CVD to form a gate electrode 18b of the buried gate 18 in the trench 13a, and the polysilicon film is patterned by using a resist mask to form a gate electrode 15b of the transfer gate 15. A gate electrode and other components constituting a MOS transistor are also formed in the semiconductor substrate 11 excepting a region in which the solid-state image sensing device 10 is to be formed.

Embodiment 2

Figure 10A:
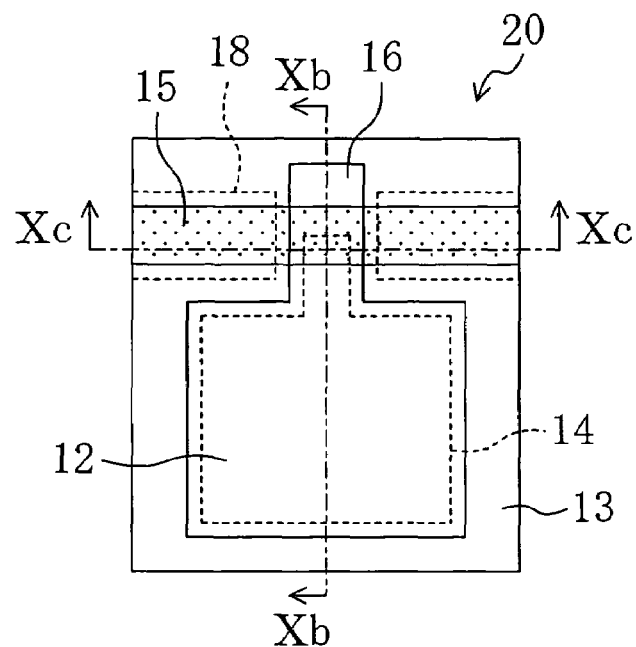
FIG. 10A is a plan view schematically illustrating a structure of a solid-state image sensing device according to Embodiment 2 of the present invention.
Figure 10B:
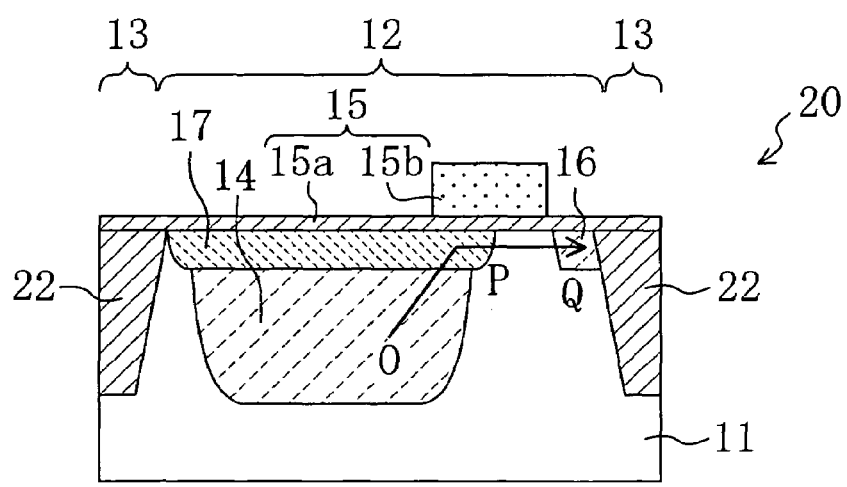
FIG. 10B is a cross section along the line Xb-Xb in FIG. 10A.
Figure 10C:
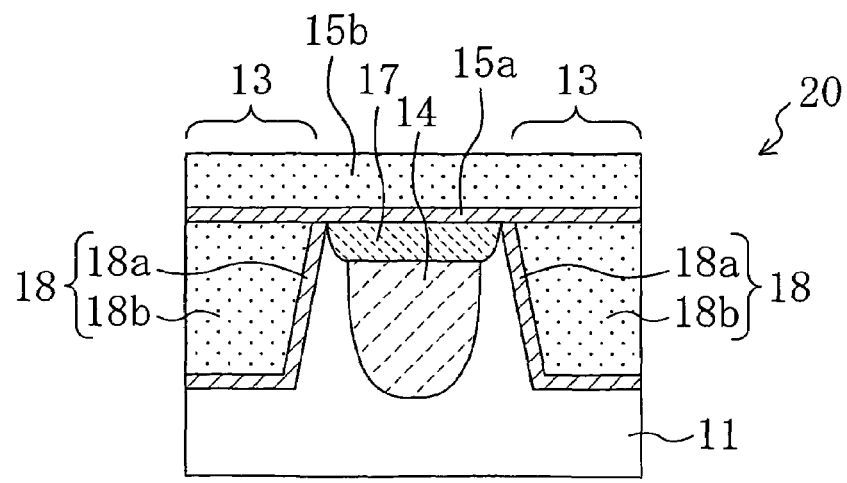
FIG. 10C is a cross section along the line Xc-Xc in FIG. 10A.

FIGS. 10A through 10C schematically illustrate a structure of a solid-state image sensing device 20 according to Embodiment 2 of the present invention, where FIG. 10A is a plan view of the solid-state image sensing device 20, FIG. 10B is a cross section along the line Xb-Xb in FIG. 10A, and FIG. 10C is a cross section along the line Xc-Xc in FIG. 10A.

In Embodiment 1, the buried gate 18 embedded in the device isolation region 13 surrounds the charge storage portion 14. Compared to this, in a structure in Embodiment 2, a buried gate 18 is formed in a part of a device isolation region 13. This structure is especially effective, for example, in a case shown in FIG. 10A where it is difficult to provide a gate electrode 18b of the buried gate 18 in a region having a narrow width (a region where a transfer gate is not formed) in the device isolation region 13.

As shown in FIG. 10B, a transfer gate 15 includes a gate dielectric film (second gate dielectric film) 15a and a gate electrode (second gate electrode) 15b on a semiconductor substrate 11. The buried gate 18 is, as shown in FIGS. 10A and 10C, embedded in part of the device isolation region 13 under the transfer gate 15. As shown in FIG. 10C, the buried gate 18 includes a gate dielectric film (first gate dielectric film) 18a and a gate electrode (first gate electrode) 18b in a trench of the semiconductor substrate 11.

In Embodiment 2, the buried gate 18 is embedded immediately below the transfer gate 15 as shown in FIG. 10A. Therefore, it is possible to electrically contact the buried gate 18 with the transfer gate 15 easily.

Figure 11:
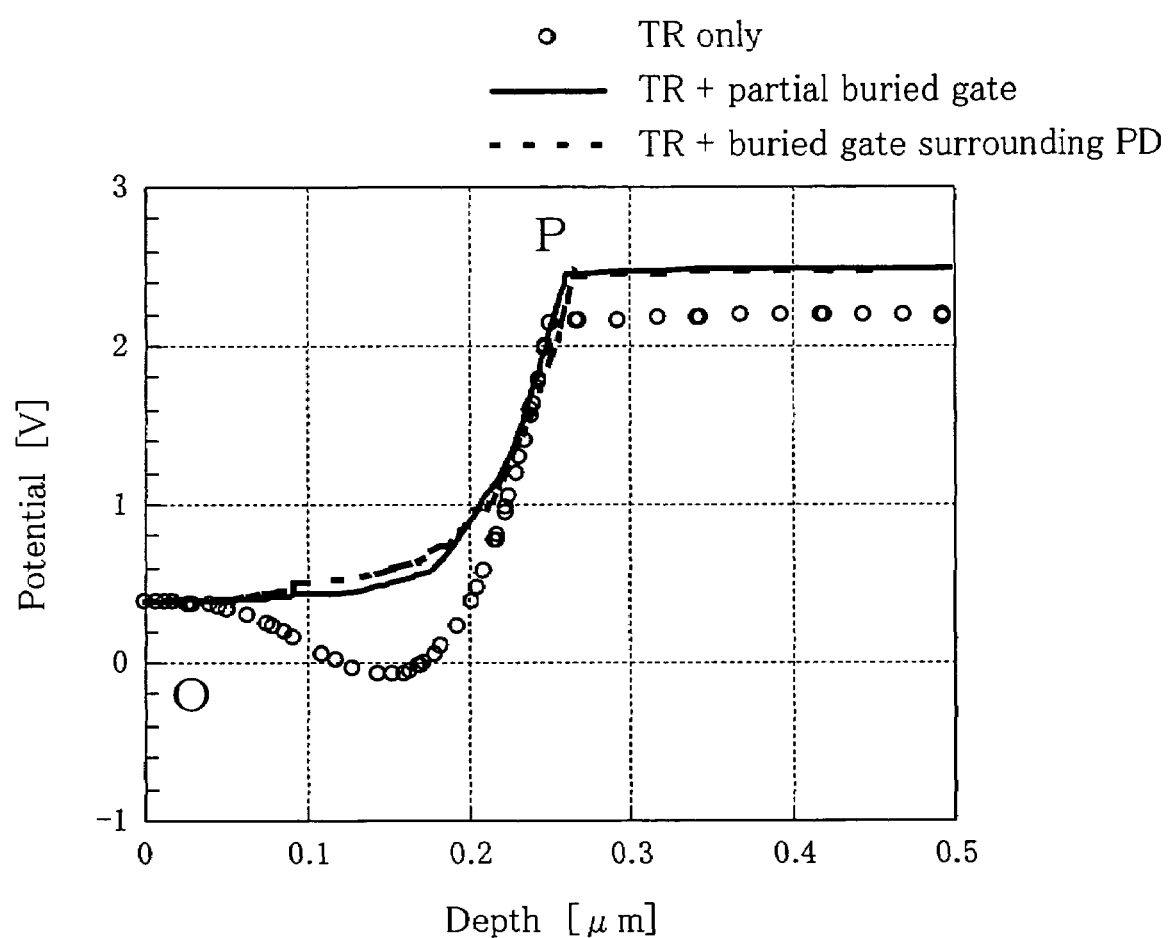
FIG. 11 is a graph illustrating potential distribution in a charge storage portion according to Embodiment 2 of the present invention.

FIG. 11 is a graph comparatively showing potential distribution in a case where a voltage is applied only to the transfer gate 15, and in a case where a voltage is applied both to the transfer gate 15 and the buried gate 18 embedded in the part of the device isolation region 13, where the charge storage portion 14 is formed under such a condition that a declined part appears in the potential distribution shown in FIG. 1B (implantation energy: 600 KeV).

In FIG. 11, it can be seen that effects of preventing the occurrences of declined part in the profile of potential distribution in a case of the buried gate 18 embedded only in the part of the device isolation region 13 (as a graph indicated by the continuous line) are as sufficient as in a case of the buried gate 18 surrounding the charge storage portion (photodiode: PD) 14 (as a graph indicated by the dashed line).

In Embodiment 2, the buried gate 18 is embedded in part of the device isolation region 13 under the transfer gate 15. However, positions of the buried gate 18 are not particularly limited. In the device isolation region 13, the buried gate 18 may be embedded in a position most distant from the transfer gate 15.

Next, a manufacturing method of the solid-state image sensing device 20 of Embodiment 2 will be described with reference to the drawings. FIGS. 12A through 12C and FIGS. 13A through 13C are cross sections along the line Xb-Xb in FIG. 10A, with which steps are described. FIGS. 14A through 14C and FIGS. 15A through 15C are cross sections along the line Xc-Xc in FIG. 10A, with which steps are described. Descriptions of steps corresponding to the manufacturing method described in Embodiment 1 are omitted.

Figure 12A:
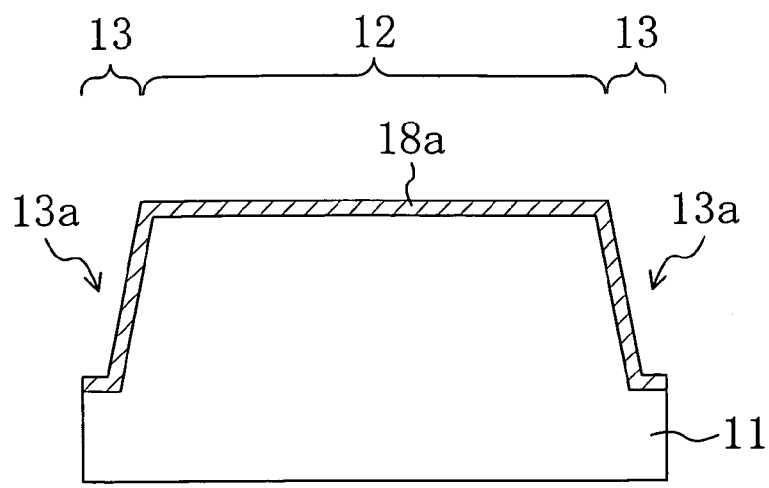
FIGS. 12A through 12C are cross sections along the line Xb-Xb in FIG. 10A, with which steps of a manufacturing method of the solid-state image sensing device according to Embodiment 2 of the present invention are illustrated.
Figure 14A:
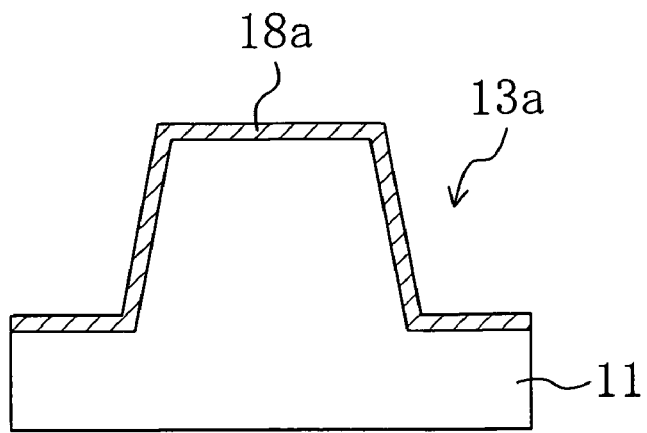
FIGS. 14A through 14C are cross sections along the line Xc-Xc in FIG. 10A, with which steps of a manufacturing method of the solid-state image sensing device according to Embodiment 2 of the present invention are illustrated.

First, referring to FIGS. 12A and 14A, a trench 13a having a depth of about 0.3 μm is formed in a semiconductor substrate 11 formed by a P-type silicon substrate. The trench 13a is to be a device isolation region 13. Then, a gate dielectric film 18a of a buried gate 18 is formed by, for example, a silicon oxide film having a thickness of 9 nm on a surface of the semiconductor substrate 11 and on side surfaces of the trench 13a.

Before a gate dielectric film 18a is formed, an ion implantation of a P-type impurity, such as boron (B), into the semiconductor substrate 11 from the side surfaces of the trench 13a may be performed so as to form a P-type isolation diffusion layer (not shown) along the side surfaces of the trench 13a.

Figure 12B:
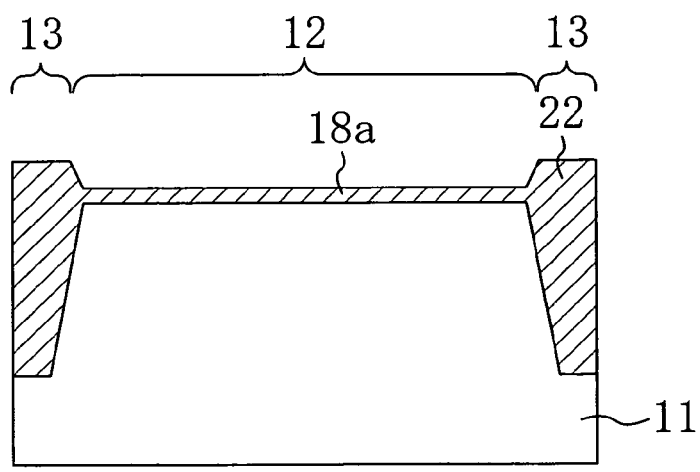
Figure 14B:
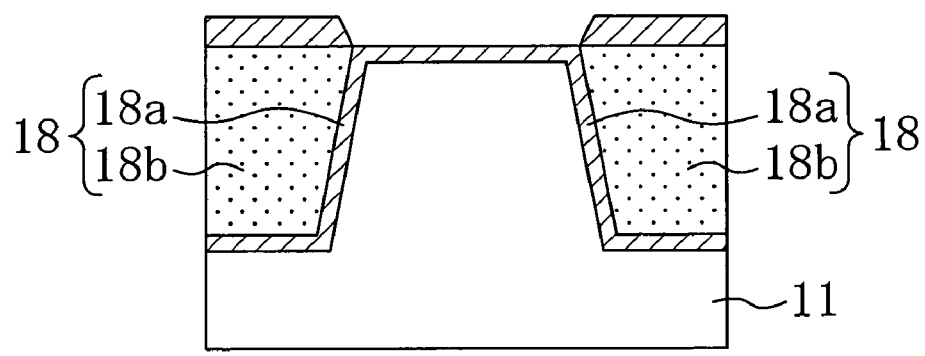

Next, referring to FIG. 14B, a polysilicon film is partially formed in the trench 13a, a dielectric film 22, such as silicon oxide film, is further deposited and then planarized to form a gate electrode 18b of the buried gate 18, while referring to FIG. 12B, the dielectric film 22 is formed in a trench 13a of the device isolation region 13 in which the buried gate 18 is not to be formed.

Figure 12C:
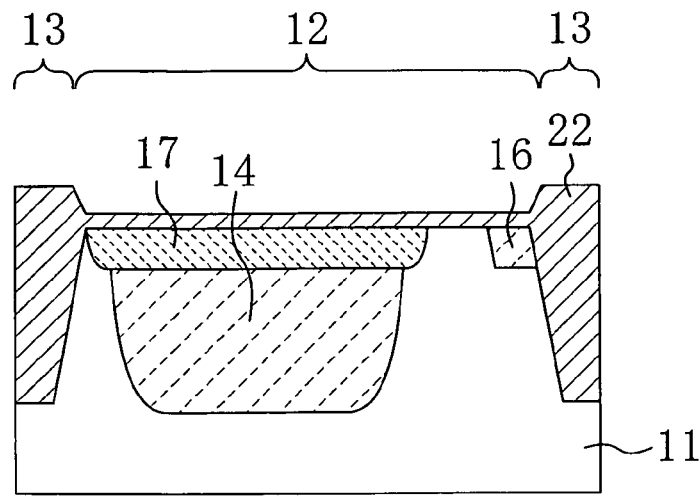
Figure 14C:
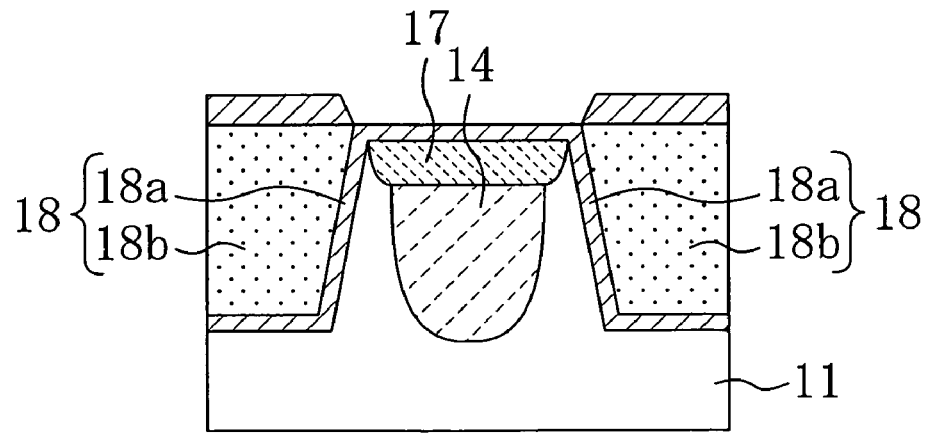

Next, referring to FIGS. 12C and 14C, a depletion prevention region 17 which is a P-Type impurity layer, a charge storage portion 14 formed by an N-type impurity layer, and a floating diffusion portion 16 are formed in the semiconductor substrate 11 using a resist mask. In this way, the charge storage portion 14 having a depth of about 0.8 μm from the surface of the substrate 11 is formed. The gate dielectric film 18a is covered with the gate electrode 18b, so that the gate dielectric film 18a is not damaged by the ion implantation for forming the impurity layers.

Figure 13A:
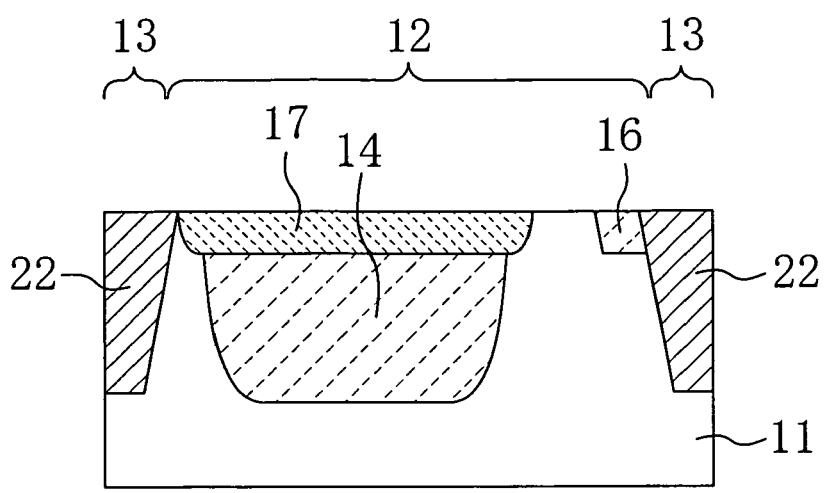
FIGS. 13A through 13C are cross sections along the line Xb-Xb in FIG. 10A, with which steps of a manufacturing method of the solid-state image sensing device according to Embodiment 2 of the present invention are illustrated.
Figure 13B:
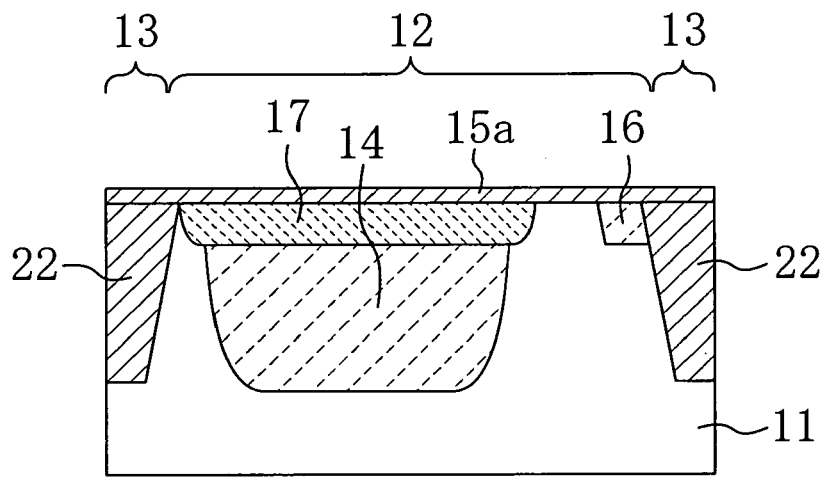
Figure 15A:
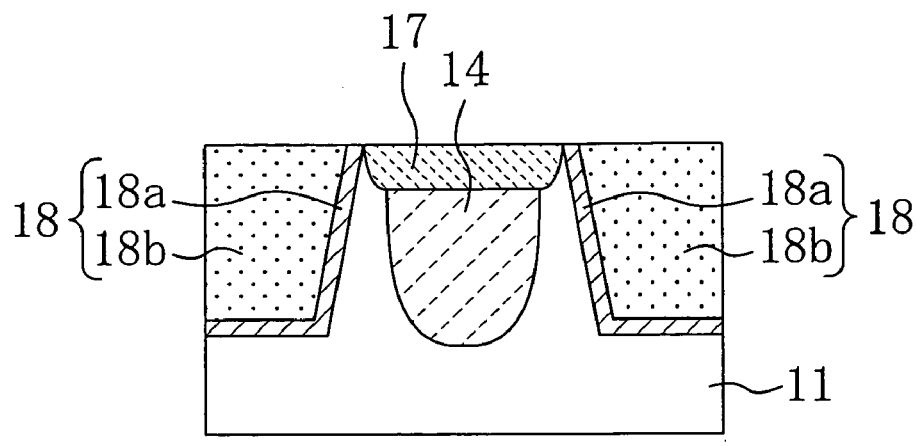
FIGS. 15A through 15C are cross sections along the line Xc-Xc in FIG. 10A, with which steps of a manufacturing method of the solid-state image sensing device according to Embodiment 2 of the present invention are illustrated.
Figure 15B:
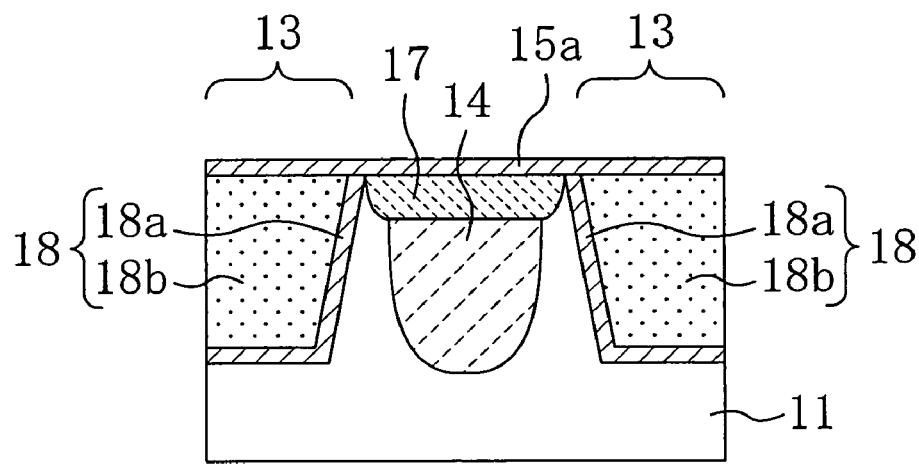

Next, referring to FIGS. 13A and 15A, the gate dielectric film 18a of the buried gate 18 on the semiconductor substrate 11 is removed. Then, referring to FIGS. 13B and 15B, the gate dielectric film 15a of the transfer gate 15 is formed on the semiconductor substrate 11.

Figure 13C:
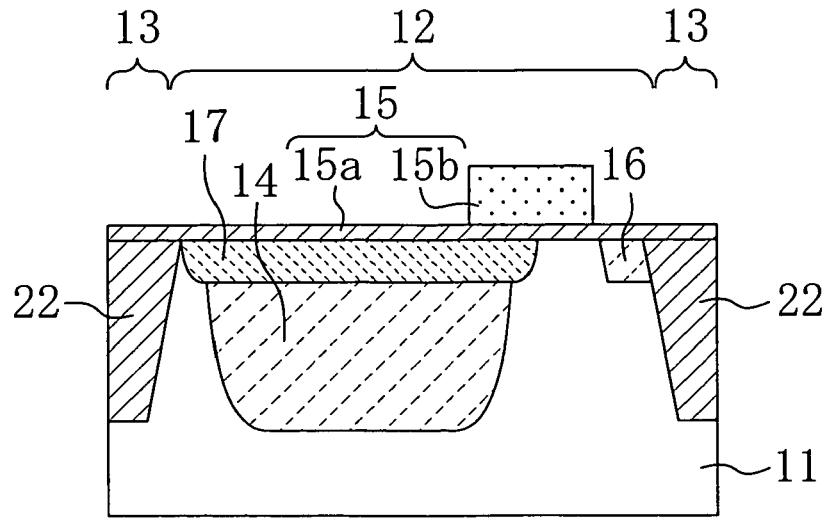
Figure 15C:
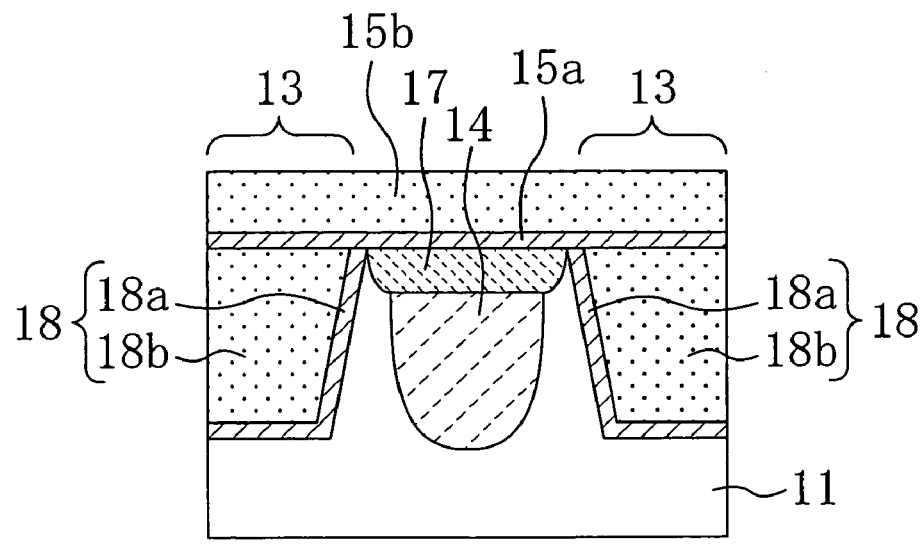
Figure 16:
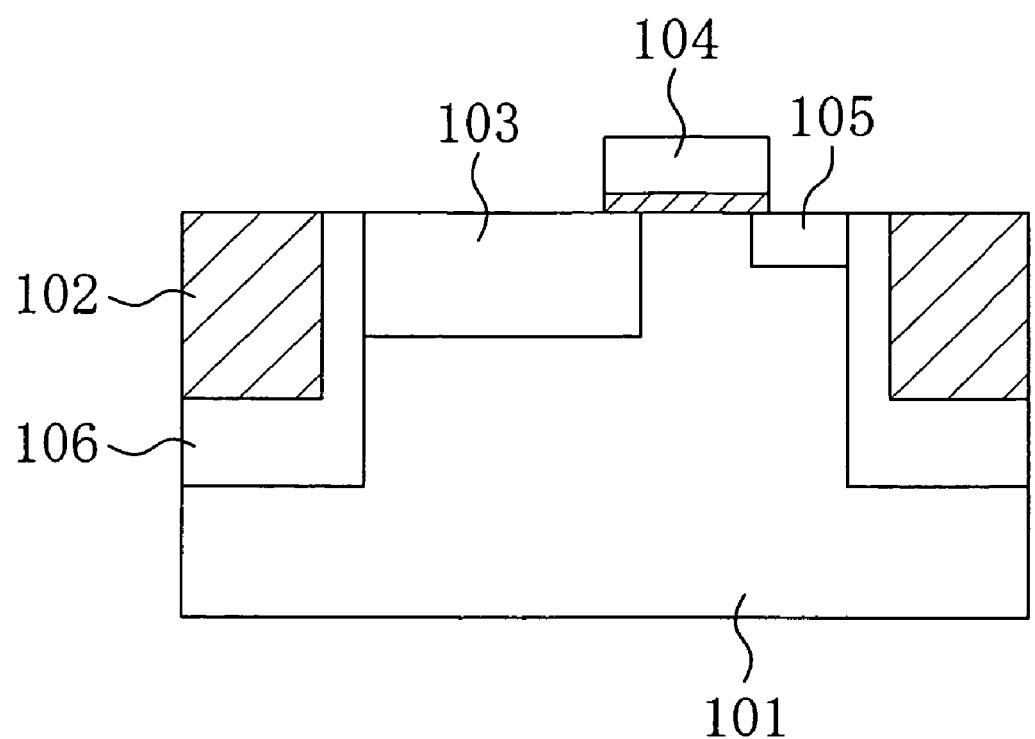
FIG. 16 is a cross section illustrating a structure of a conventional solid-state image sensing device.

Finally, referring to FIGS. 13C and 15C, the polysilicon film is deposited on the gate dielectric film 15a. Then, patterning is performed by using a resist mask to form a gate electrode 15b of the transfer gate 15. Opening a contact window (not shown) in a part of the gate dielectric film 15a before the deposition of the polysilicon enables the gate electrode 18b of the buried gate 18 to contact the gate electrode 15b of the transfer gate 15.

The present invention has been explained with reference to preferable embodiments. However, these descriptions are not to limit the scope of the invention, and of course, various modifications are possible.

What is claimed is:

1. A solid-state image sensing device comprising:
    a charge storage portion formed in a semiconductor substrate;
    a floating diffusion portion formed correspondingly to the charge storage portion where the floating diffusion portion is at a location spaced from the charge storage portion in the semiconductor substrate;
    a device isolation region formed in the semiconductor substrate so as to surround sides of a pixel portion including the charge storage portion and the floating diffusion portion in the semiconductor substrate;
    a transfer gate formed on the pixel portion in the semiconductor substrate; and
    a buried gate embedded in at least a part of the device isolation region;
    wherein a first gate electrode of the buried gate is electrically connected to a second gate electrode of the transfer gate,
    the second gate electrode is disposed over a region located between the charge storage portion and the floating diffusion portion of the pixel portion, and
    the first gate electrode is, when viewed from the charge storage portion, formed in the device isolation region opposite to a side where the second gate electrode is disposed.

2. A solid-state image sensing device of claim 1,
    wherein the first gate electrode is formed through a first gate dielectric film formed in a trench of the semiconductor substrate,
    the second gate electrode is formed through a second gate dielectric film on the pixel portion, and
    the first gate dielectric film and the second gate dielectric film are continuously formed by the same dielectric film.

3. A solid-state image sensing device of claim 1, wherein the first gate electrode and the second gate electrode are continuously formed by the same conductive film.

4. A solid-state image sensing device of claim 1, wherein the buried gate embedded in the device isolation region surrounds the charge storage portion.

5. A solid-state image sensing device of claim 1, wherein the buried gate is embedded in part of the device isolation region under the transfer gate.

6. A solid-state image sensing device of claim 1, wherein the device isolation region has a depth of $\frac{1}{3}$ or more of a depth of the charge storage portion.

7. A solid-state image sensing device of claim 1, wherein the charge storage portion has a depth of 0.3 μm or more from a surface of the semiconductor substrate.

8. A solid-state image sensing device of claim 1, wherein the device isolation region has a trench structure.

9. The solid-state image sensing device of claim 1, wherein an upper surface of the first gate electrode is lower than an upper surface of the second gate electrode.

* * * * *